(12) United States Patent
Dalton et al.

(10) Patent No.: US 8,004,289 B2
(45) Date of Patent: *Aug. 23, 2011

(54) WAFER-TO-WAFER ALIGNMENTS

(75) Inventors: Thomas Joseph Dalton, Ridgefield, CT (US); Jeffrey Peter Gambino, Westford, VT (US); Mark David Jaffe, Shelburne, VT (US); Stephen Ellinwood Luce, Underhill, VT (US); Edmund Juris Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 325 days.

This patent is subject to a terminal disclaimer.

(21) Appl. No.: 12/198,221

(22) Filed: Aug. 26, 2008

(65) Prior Publication Data
US 2008/0308948 A1   Dec. 18, 2008

Related U.S. Application Data

(60) Continuation of application No. 11/557,668, filed on Nov. 8, 2006, now Pat. No. 7,474,104, which is a division of application No. 11/275,112, filed on Dec. 12, 2005, now Pat. No. 7,193,423.

(51) Int. Cl.
  *G01R 27/26* (2006.01)
  *G01R 31/308* (2006.01)
(52) U.S. Cl. .................................. 324/662; 324/754.28
(58) Field of Classification Search .................. 324/662, 324/758
See application file for complete search history.

(56) References Cited

U.S. PATENT DOCUMENTS

| | | | |
|---|---|---|---|
| 3,723,866 A | 3/1973 | Michaud et al. |
| 4,310,806 A | 1/1982 | Ogasawara |
| 4,459,702 A | 7/1984 | Medwin |
| 4,566,193 A | 1/1986 | Hackleman et al. |
| 4,929,893 A | 5/1990 | Sato et al. |
| 5,022,580 A | 6/1991 | Pedder |
| 5,130,660 A | 7/1992 | Flint et al. |
| 6,114,213 A | 9/2000 | Kim |
| 6,420,892 B1 | 7/2002 | Krivy et al. |
| 6,518,679 B2 | 2/2003 | Lu et al. |
| 6,693,441 B2 | 2/2004 | Lane et al. |
| 6,822,472 B1 | 11/2004 | Das et al. |
| 2002/0191835 A1 | 12/2002 | Lu et al. |

FOREIGN PATENT DOCUMENTS

GB    2148515 A    5/1984

OTHER PUBLICATIONS

Notice of Allowance (Mail Date Aug. 11, 2008) for U.S. Appl. No. 11/557,668; Filing Date Nov. 8, 2006; Confirmation No. 1927.

*Primary Examiner* — Jeff Natalini
(74) *Attorney, Agent, or Firm* — Schmeiser, Olsen & Watts; Richard M. Kotulak

(57) ABSTRACT

Structures for aligning wafers and methods for operating the same. The structure includes (a) a first semiconductor wafer including a first capacitive coupling structure, and (b) a second semiconductor wafer including a second capacitive coupling structure. The first and second semiconductor wafers are in direct physical contact with each other via a common surface. If the first and second semiconductor wafers are moved with respect to each other by a first displacement distance of 1 nm in a first direction while the first and second semiconductor wafers are in direct physical contact with each other via the common surface, then a change of at least $10^{-18}$ F in capacitance of a first capacitor comprising the first and second capacitive coupling structures results. The first direction is essentially parallel to the common surface.

13 Claims, 11 Drawing Sheets

WAFER-TO-WAFER ALIGNMENTS

This application is a continuation application claiming priority to Ser. No. 11/557,668, filed Nov. 8, 2006, which is a divisional application of U.S. Pat. No. 7,193,423, issued on Mar. 20, 2007.

BACKGROUND OF THE INVENTION

1. Technical Field

The present invention relates to wafer-to-wafer alignments, and more specifically, to wafer-to-wafer alignments using capacitive coupling structures.

2. Related Art

In the prior art, two wafers containing devices can be aligned and then bonded together so as to, among other purposes, double the device density. As a result, there is always a need for a structure (and methods for operating the same) that helps achieve good wafer-to-wafer alignments for subsequent wafer bonding process.

SUMMARY OF THE INVENTION

The present invention provides a structure, comprising (a) a first semiconductor wafer including a first capacitive coupling structure; and (b) a second semiconductor wafer including a second capacitive coupling structure, wherein the first and second semiconductor wafers are in direct physical contact with each other via a common surface, wherein if the first and second semiconductor wafers are moved with respect to each other by a first displacement distance of 1 nm in a first direction while the first and second semiconductor wafers are in direct physical contact with each other via the common surface, then a change of at least $10^{-18}$ F in capacitance of a first capacitor comprising the first and second capacitive coupling structures results, and wherein the first direction is essentially parallel to the common surface.

The present invention also provides a wafer alignment method, comprising providing a structure which includes (a) a first semiconductor wafer comprising a first capacitive coupling structure, and (b) a second semiconductor wafer comprising a second capacitive coupling structure; measuring a capacitance of a first capacitor comprising the first and second capacitive coupling structures; and moving the first and second semiconductor wafers with respect to each other in a first direction while the first and second semiconductor wafers are in direct physical contact with each other via a common surface, until the first capacitor has a first maximum capacitance as measured in said measuring the capacitance of the first capacitor, wherein the first direction is essentially parallel to the common surface.

The present invention provides a structure (and methods for operating the same) that helps achieve good wafer-to-wafer alignments for subsequent wafer bonding process.

DETAILED DESCRIPTION OF THE INVENTION

Figure 1:
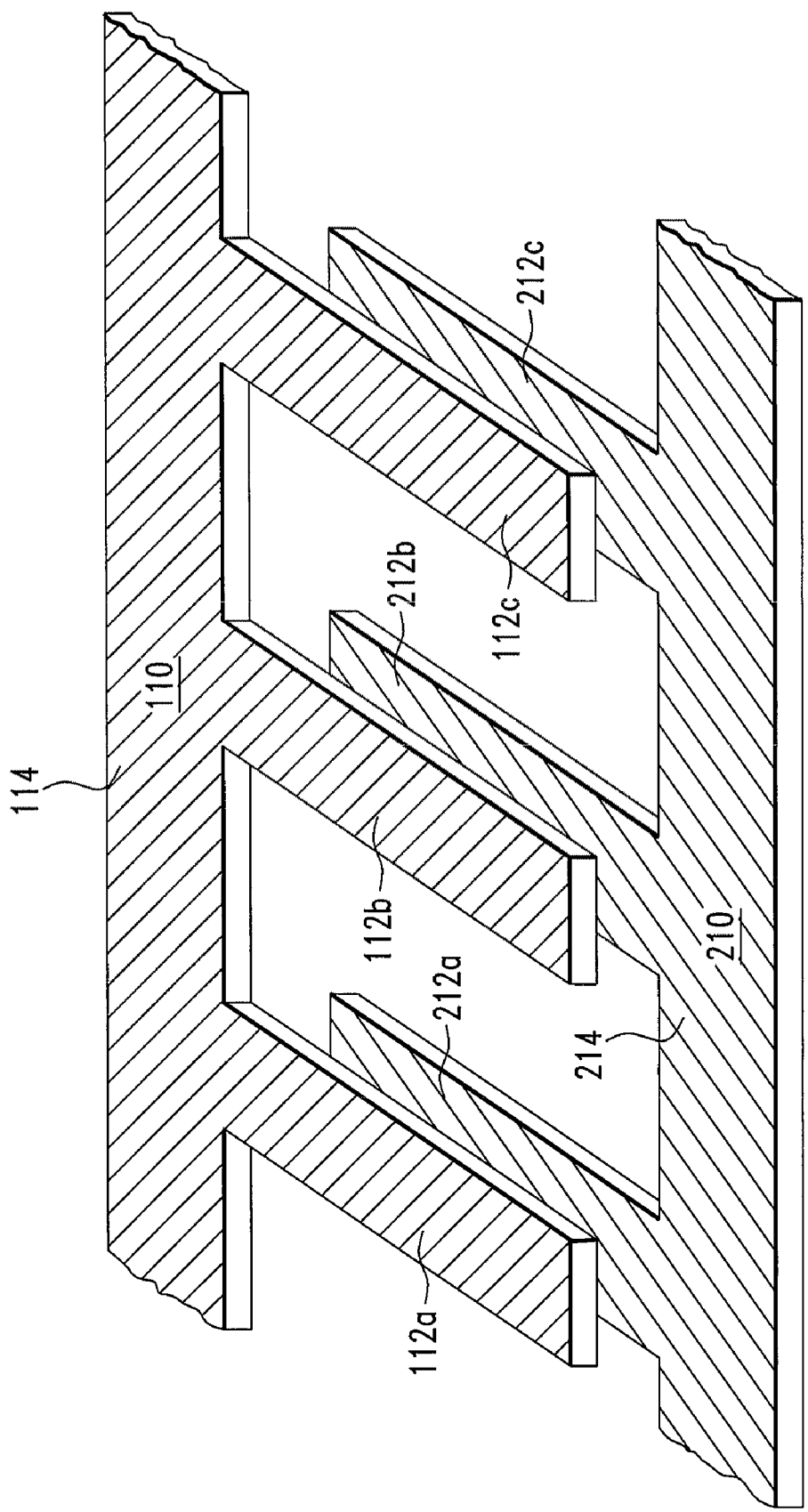
FIGS. 1, 1A, 2, and 2A show different views of two capacitive coupling structures, in accordance with embodiments of the present invention.

FIGS. 1, 1A, 2, and 2A show different views of two capacitive coupling structures 110 and 210, in accordance with embodiments of the present invention. More specifically, FIG. 1 shows a perspective view of the two capacitive coupling structures 110 and 210. Illustratively, the capacitive coupling structure 110 comprises three capacitive coupling fingers 112a, 112b, and 112c and a common base 114, wherein the common base 114 physically holds and electrically connects together the three capacitive coupling fingers 112a, 112b, and 112c.

Similarly, the capacitive coupling structure 210 comprises three capacitive coupling fingers 212a, 212b, and 212c and a common base 214, wherein the common base 214 physically holds and electrically connects together the three capacitive coupling fingers 212a, 212b, and 212c. In one embodiment, each of the capacitive coupling structures 110 and 210 is made of an electrically conducting material (such as a metal).

Figure 1A:
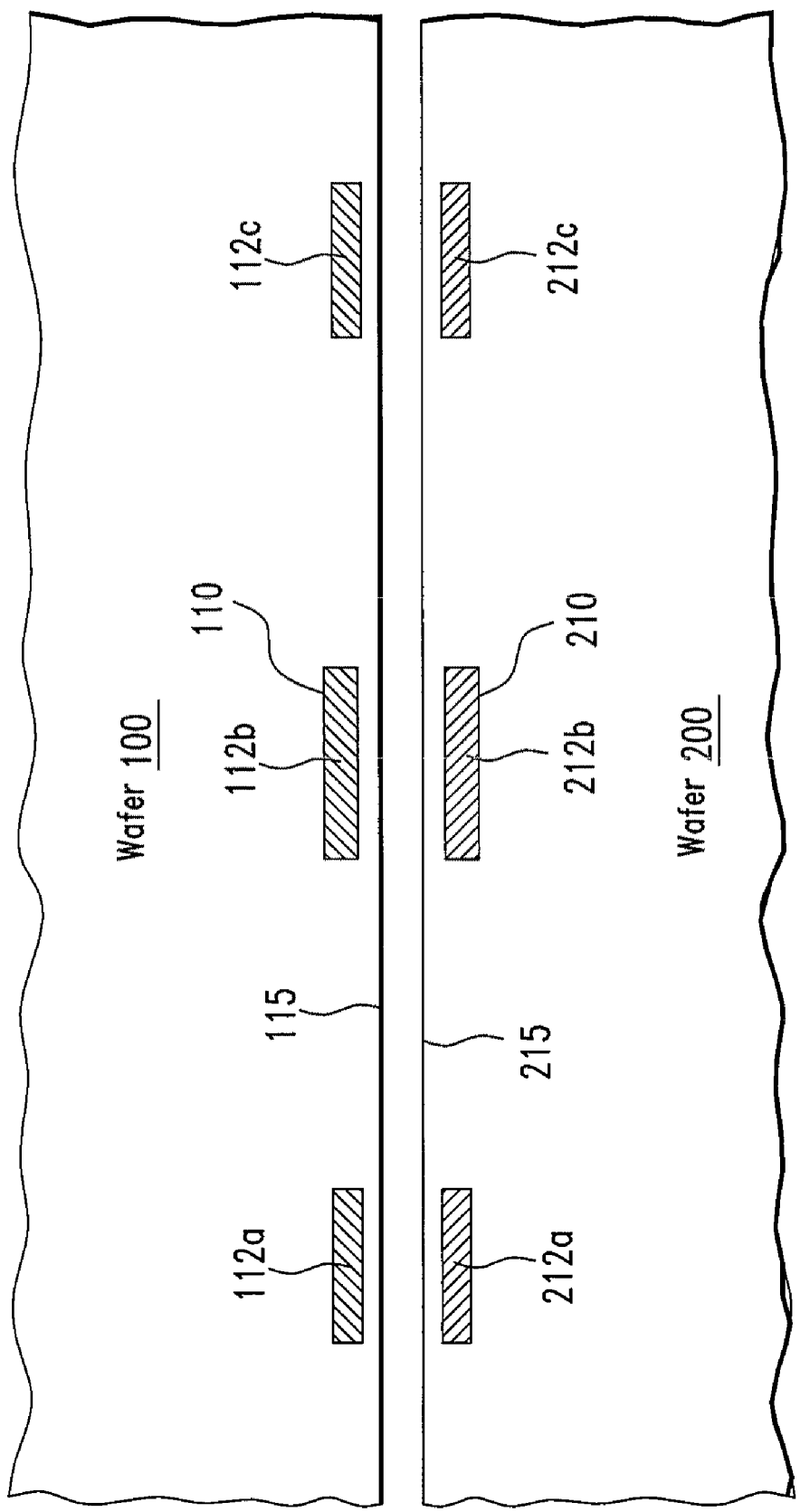

FIG. 1A shows a cross section view of the two capacitive coupling structures 110 and 210 in two semiconductor wafers 100 and 200, respectively.

The capacitive coupling fingers 112a, 112b, and 112c of the capacitive coupling structure 110 are buried in the semiconductor wafer 100 but are physically close to a top surface 115 of the semiconductor wafer 100. Similarly, the capacitive coupling fingers 212a, 212b, and 212c of the capacitive coupling structure 210 are buried in the semiconductor wafer 200 but are physically close to a top surface 215 of the semiconductor wafer 200.

In one embodiment, if the two semiconductor wafers 100 and 200 are moved with respect to each other while the their top surfaces 115 and 215 are in direct physical contact with each other and in the same plane (as happening during the alignment of the two semiconductor wafers 100 and 200), then the capacitive coupling fingers 112a, 112b, and 112c (i) do not come into direct physical contact with and (ii) are electrically insulated from the capacitive coupling fingers 212a, 212b, and 212c. In other words, the two capacitive coupling structures 110 and 210 are electrically insulated from each other during such an alignment.

In FIGS. 1 and 1A, the capacitive coupling fingers 112a, 112b, and 112c are completely aligned with the capacitive coupling fingers 212a, 212b, and 212c, respectively. If so, it is said that the two capacitive coupling structures 110 and 210 are completely aligned. In one embodiment, if the two capacitive coupling structures 110 and 210 are completely aligned, then the contact pads (not shown, but electrically coupled to the devices and wires of the wafer 100) fabricated on the top surface 115 are in direct physical contact one-to-one with the contact pads (not shown but electrically coupled to the devices and wires of the wafer 200) fabricated on the top surface 215 such that the two semiconductor wafers 100 and 200 can be now bonded together. In one embodiment, when the two capacitive coupling structures 110 and 210 are completely aligned, the capacitance of a capacitor 110,210 comprising the two capacitive coupling structures 110 and 210 is maximum.

Figure 2:
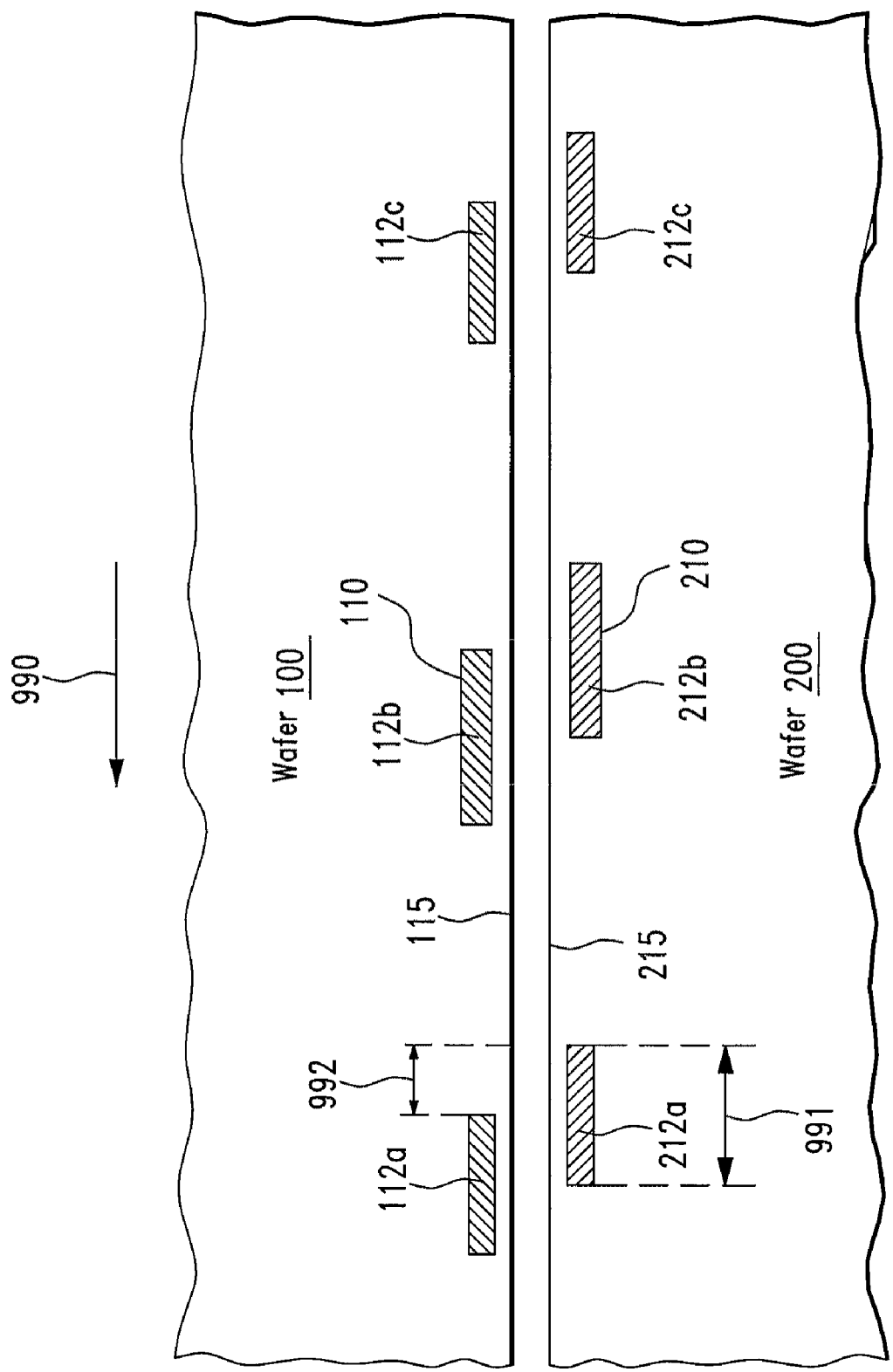
Figure 2A:
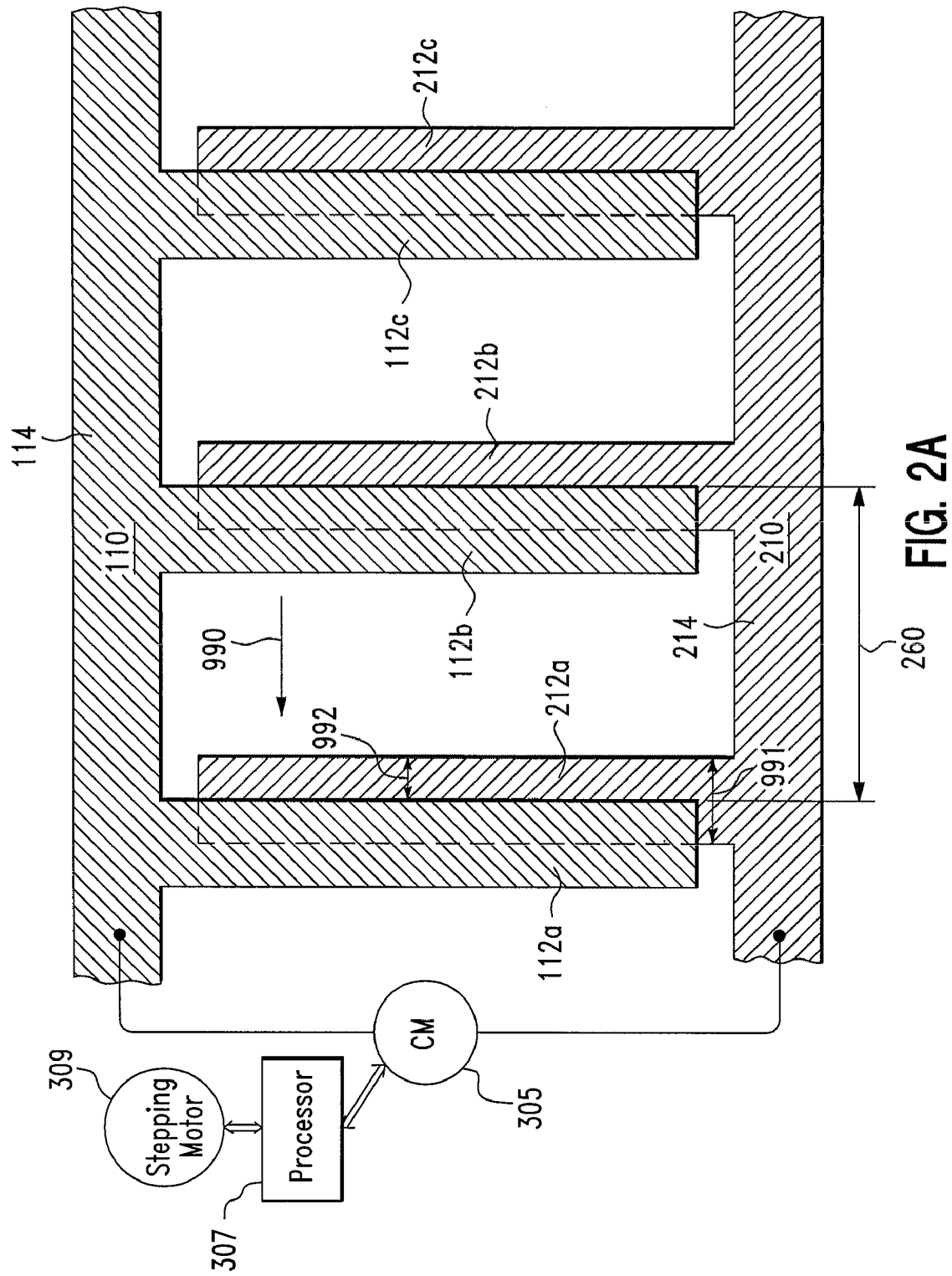

FIG. 2 shows the two semiconductor wafers 100 and 200 after the semiconductor wafer 100 moves to the left in a direction 990 with respect to the semiconductor wafer 200 by a displacement distance 992 equal to, illustratively, one half the finger width 991 of the capacitive coupling finger 212a. FIG. 2A shows a top down view of only the two capacitive coupling structures 110 and 210 of FIG. 2 (i.e., after the movement).

With reference to FIGS. 2 and 2A, assume that all the capacitive coupling fingers of the two capacitive coupling structures 110 and 210 have the same finger width. Then, this movement of the semiconductor wafer 100 with respect to the semiconductor wafer 200 reduces the capacitance of the capacitor 110,210 by half. This is because the capacitance of the capacitor 110,210 is proportional to the overlapping areas of the two capacitive coupling structures 110 and 210. Because the movement of the semiconductor wafer 100 with respect to the semiconductor wafer 200 reduces the overlapping areas of the two capacitive coupling structures 110 and 210 by half, the capacitance of the capacitor 110,210 is reduced also by half.

In one embodiment, each of the capacitive coupling structures 110 and 210 has N capacitive coupling fingers (N is a positive integer). In one embodiment, a capacitance meter 305 (FIG. 2A) is electrically coupled to the two capacitive coupling structures 110 and 210 so as to measure the capacitance of the capacitor 110,210 during the alignment of the semiconductor wafers 100 and 200.

In one embodiment, the semiconductor wafers 100 and 200 are aligned for bonding as follows. The first and second semiconductor wafers 100 and 200 are moved with respect to each other while the their top surfaces 115 and 215 are in direct physical contact with each other and in the same plane until the capacitance of the capacitor 110,210 as measured by the capacitance meter 305 is maximum indicating the two capacitive coupling structures 110 and 210 are completely aligned. Then, the two semiconductor wafers 100 and 200 are bonded together using a conventional wafer bonding process.

Figure 2B:
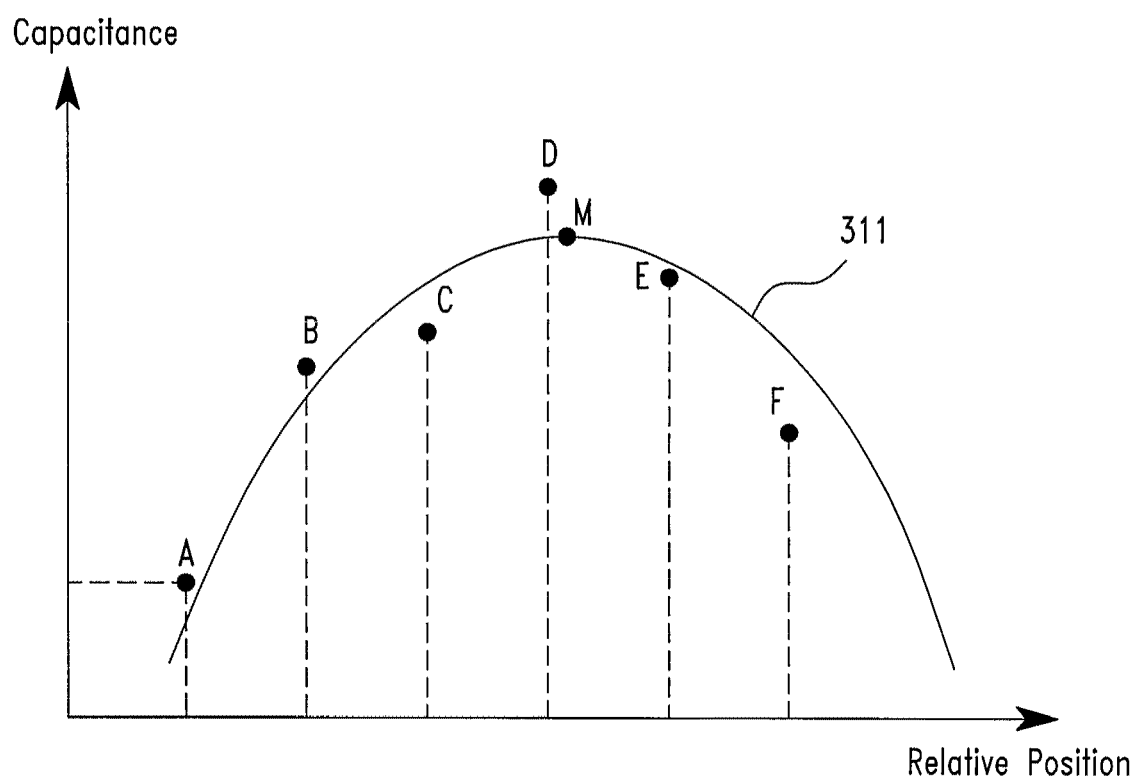
FIG. 2B shows how to align the two capacitive coupling structures of FIG. 2A, in accordance with embodiments of the present invention.

More specifically, with reference to FIGS. 2A and 2B, in one embodiment, the alignment of the semiconductor wafers 100 and 200 is controlled by a processor 307 (FIG. 2A) that is coupled to the capacitance meter 305 and a stepping motor 309 (FIG. 2A). Illustratively, during the alignment of the semiconductor wafers 100 and 200, the stepping motor 309 moves the semiconductor wafer 100 with respect to the semiconductor wafer 200 under the control of the processor 307.

In one embodiment, the alignment of the semiconductor wafers 100 and 200 is performed as follows. The stepping motor 309 moves the semiconductor wafer 100 with respect to the semiconductor wafer 200 in equal steps in the direction 990 (FIG. 2A) through relative positions corresponding to points A, B, C, D, E, and F (or in short, the relative positions A, B, C, D, E, and F, respectively) in that order while the processor 307 collects capacitance measurements at each of the relative positions A, B, C, D, E, and F. At relative position F, the processor 307 recognizes that there was two capacitance drops in a row. In response, the processor 307 generates a fitting curve 311 (FIG. 2B) for the points A, B, C, D, E, and F and finds the maximum point M of the fitting curve 311. In one embodiment, the fitting curve 311 is generated using the least-square quadratic curve-fitting method. Next, the processor 307 determines that the relative position on the horizontal axis associated with the maximum point M is closest to relative position D. As a result, the processor 307 causes the stepping motor 309 to move the semiconductor wafer 100 back to relative position D, and the alignment of the semiconductor wafers 100 and 200 is complete in the direction 990 (FIG. 2A).

In one embodiment, if the first and second semiconductor wafers 100 and 200 are moved with respect to each other while they are in direct physical contact with each other via a common surface 115,215 (because the top surfaces 115 and 215 merge) by a displacement distance of 1 nm in the direction 990 (or in a direction opposite to the direction 990), then a change of at least $10^{-18}$ F in capacitance of the capacitor 110,210 results.

Figure 3A:
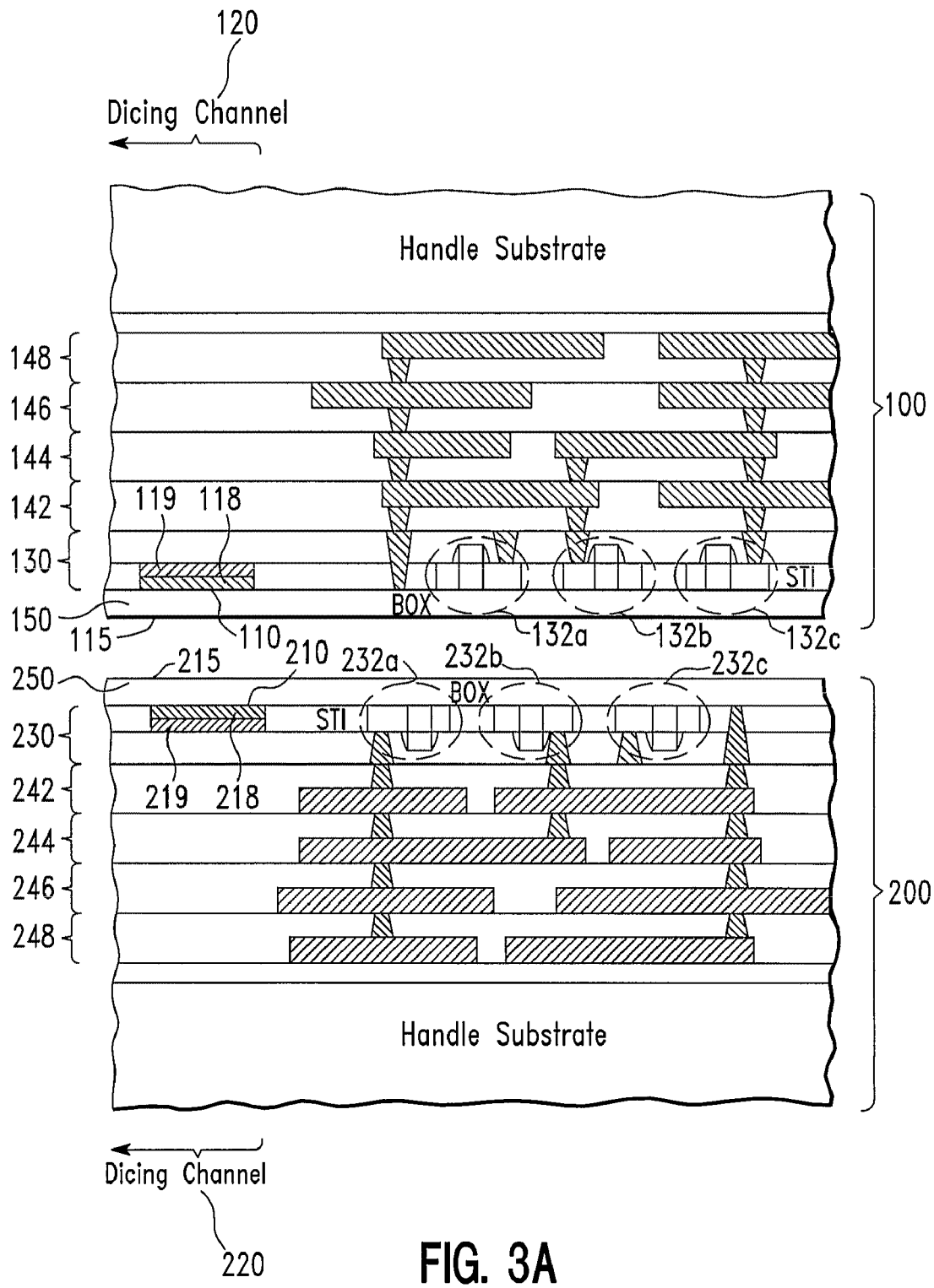
FIGS. 3A-3B show a first position of the two capacitive coupling structures of FIG. 1 in two semiconductor wafers, in accordance with embodiments of the present invention.
Figure 3B:
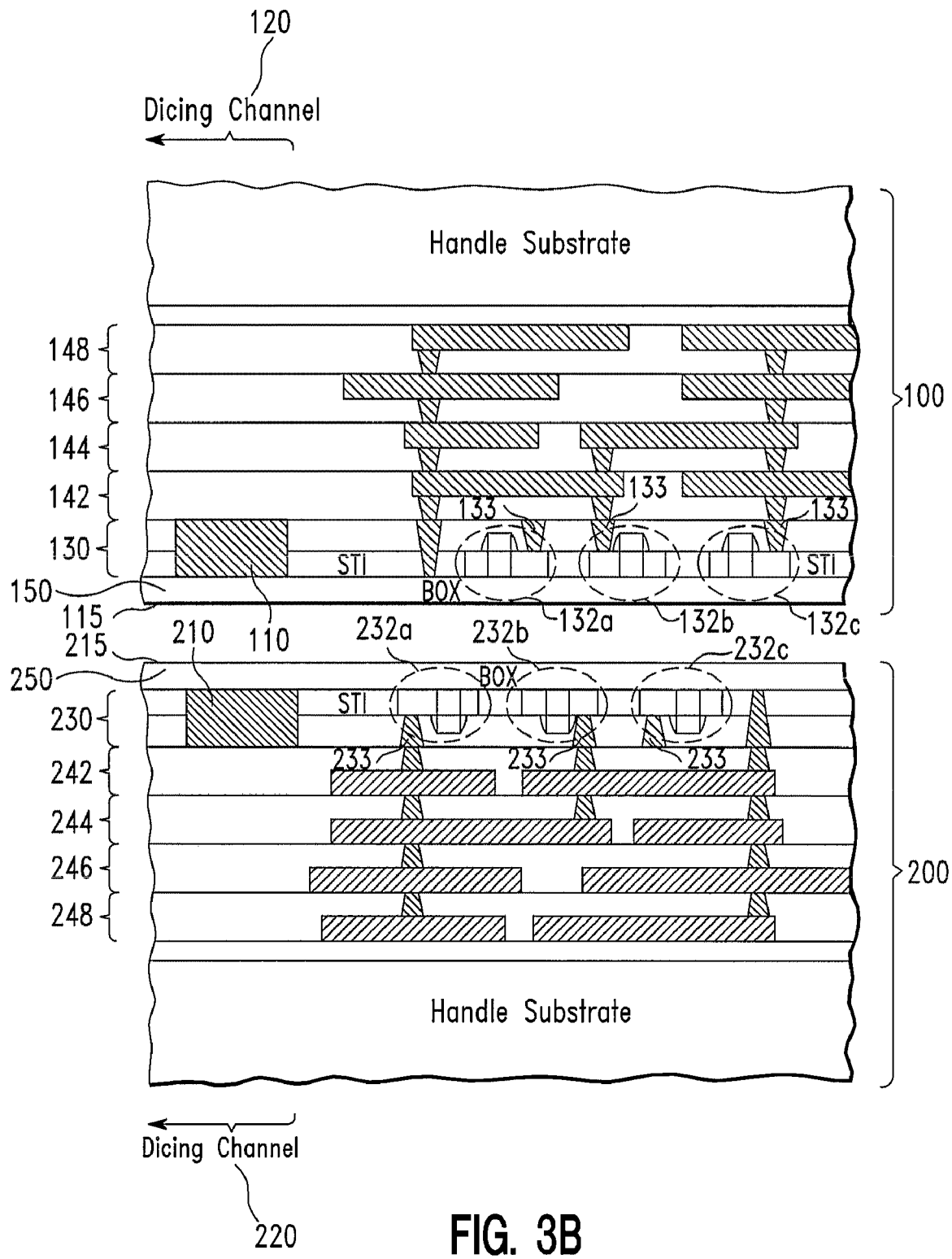

FIGS. 3A-3B show a first position of the two capacitive coupling structures 110 and 210 in the two semiconductor wafers 100 and 200, respectively, in accordance with embodiments of the present invention. More specifically, with reference to FIG. 3A, the capacitive coupling structure 110 resides in a dicing channel 120 of the semiconductor wafer 100 and in a device layer 130 that comprises illustratively, transistors 132a, 132b, and 132c. It should be noted that directly above the device layer 130 are, illustratively, interconnect layers 142, 144, 146, and 148 wherein the interconnect layer 148 is the top interconnect layer.

Similarly, the capacitive coupling structure 210 resides in a dicing channel 220 of the semiconductor wafer 200 and in a device layer 230 that comprises illustratively, transistors 232a, 232b, and 232c. It should be noted that directly above the device layer 230 are, illustratively, interconnect layers 242, 244, 246, and 248 wherein the interconnect layer 248 is the top interconnect layer.

In one embodiment, the alignment of the two semiconductor wafers 100 and 200 is performed by gliding the two semiconductor wafers 100 and 200 against each other such that the two top surfaces 115 and 215 slide against each other. During this alignment process, the two capacitive coupling structures 110 and 210 are always electrically insulated from each other by the buried oxide (BOX) layers 150 and 250. When the capacitance meter 305 detects a maximum capacitance of the capacitor 110,210, then the two semiconductor wafers 100 and 200 are completely aligned. It should be noted that the alignment process described above will be followed by a back-to-back wafer bonding process.

In one embodiment, the capacitive coupling structure 110 resides in the same semiconductor layer as the transistors 132a, 132b, and 132c. Illustratively, the capacitive coupling structure 110 comprises a doped silicon region 118 and a silicide region 119. In one embodiment, the doped silicon region 118 is doped at the same time the source/drain regions of the transistors 132a, 132b, and 132c are doped. Then, the silicide region 119 is formed at the same time the silicide regions (not shown) of the transistors 132a, 132b, and 132c are formed. In one embodiment, the capacitive coupling structure 210 resides is formed in the semiconductor wafer 200 in a similar manner.

FIG. 3B is similar to FIG. 3A, except that the layer 130 comprises dielectric materials in the channel region 120 and that the capacitive coupling structure 110 is surrounded by these dielectric materials. In one embodiment, the space for the capacitive coupling structure 110 is created at the time the contact holes 133 for the transistors 132a, 132b, and 132c are created. Then, the space for the capacitive coupling structure 110 and the contact holes 133 are simultaneously filled with a same conducting material (e.g., tungsten) so as to form the capacitive coupling structure 110. In one embodiment, the capacitive coupling structure 210 resides is formed in the semiconductor wafer 200 in a similar manner.

Figure 3C:
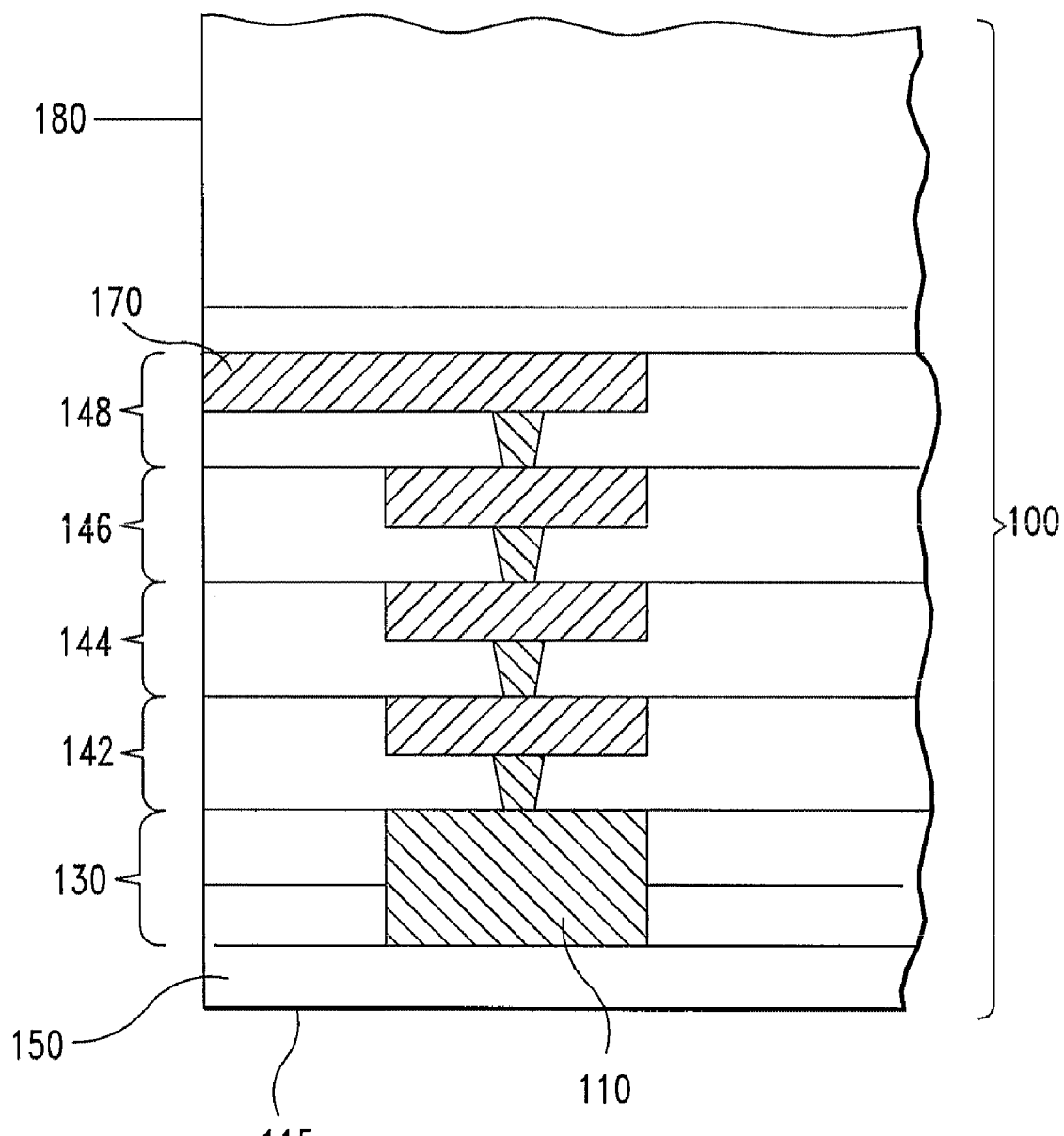
FIG. 3C shows one embodiment of one of the two capacitive coupling structures of FIG. 3B.

FIG. 3C shows how the capacitive coupling structure 110 of FIG. 3B can be connected to an edge 180 of the semiconductor wafers 100 (whether the capacitive coupling structure 110 resides in a dicing channel or in a region near the edge 180). It should be noted that the probe pad 170 on the edge 180 can be used to electrically access the capacitive coupling structure 110.

Figure 4:
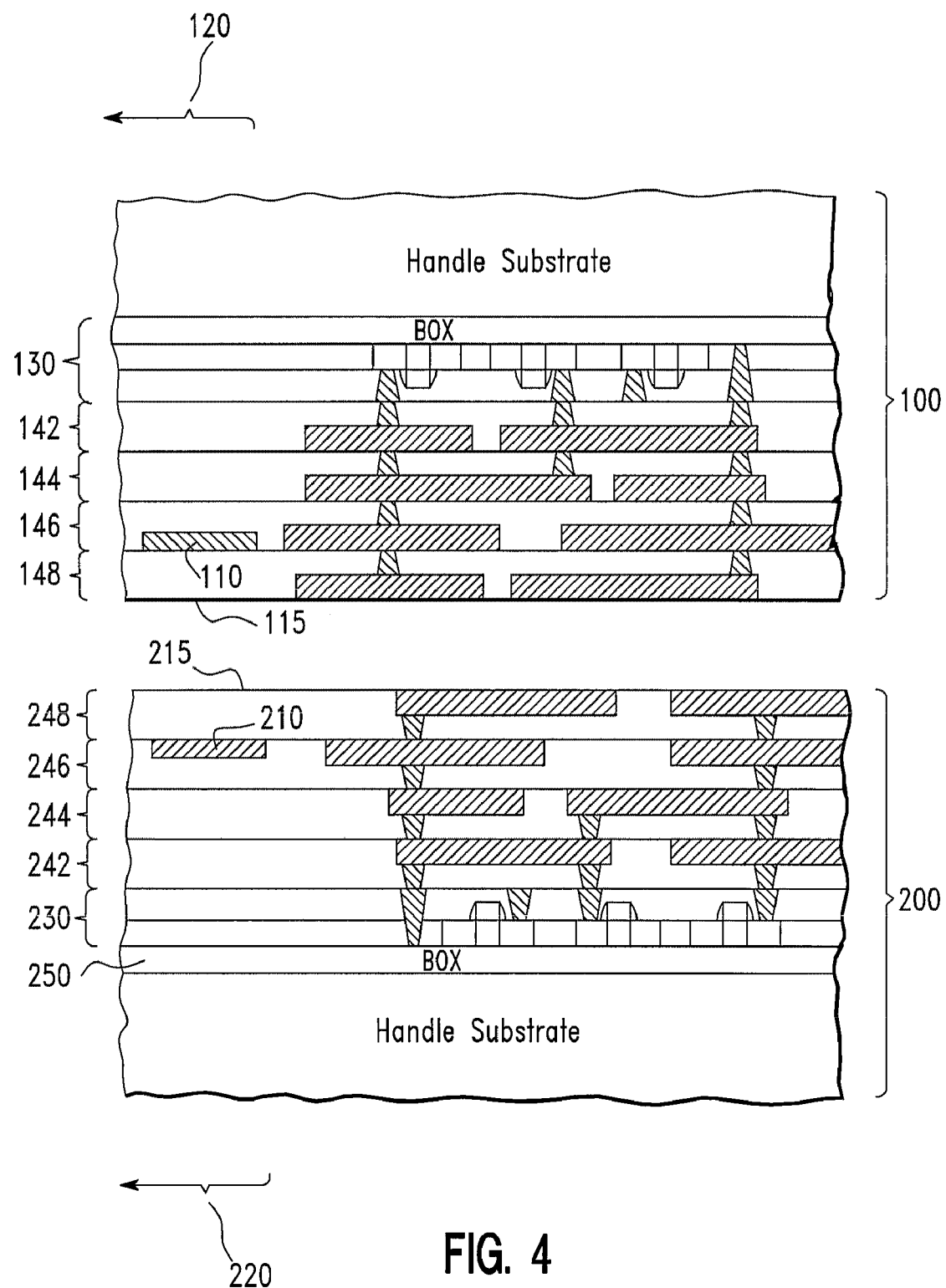
FIG. 4 shows a second position of the two capacitive coupling structures of FIG. 1 in two semiconductor wafers, in accordance with embodiments of the present invention.

FIG. 4 shows a second position of the two capacitive coupling structures 110 and 210 in the two semiconductor wafers 100 and 200, respectively, in accordance with embodiments of the present invention. More specifically, the capacitive coupling structure 110 resides in the dicing channel 120 of the semiconductor wafer 100 and in the next-to-top interconnect layer 146. Similarly, the capacitive coupling structure 210 resides in the dicing channel 220 of the semiconductor wafer 200 and in the next-to-top interconnect layer 246.

In one embodiment, the alignment of the two semiconductor wafers 100 and 200 is performed by gliding the two semiconductor wafers 100 and 200 against each other such that the two top surfaces 115 and 215 slide against each other. During this alignment process, the two capacitive coupling structures 110 and 210 are always electrically insulated from each other by the top interconnect layer 148 and 248 which comprise essentially dielectric materials in the dicing channels 120 and 220, respectively. When the capacitance meter 305 (FIG. 2A) detects a maximum capacitance of the capacitor 110,210, then the two semiconductor wafers 100 and 200 are completely aligned. It should be noted that the alignment process described above will be followed by a top-to-top wafer bonding process.

Figure 5:
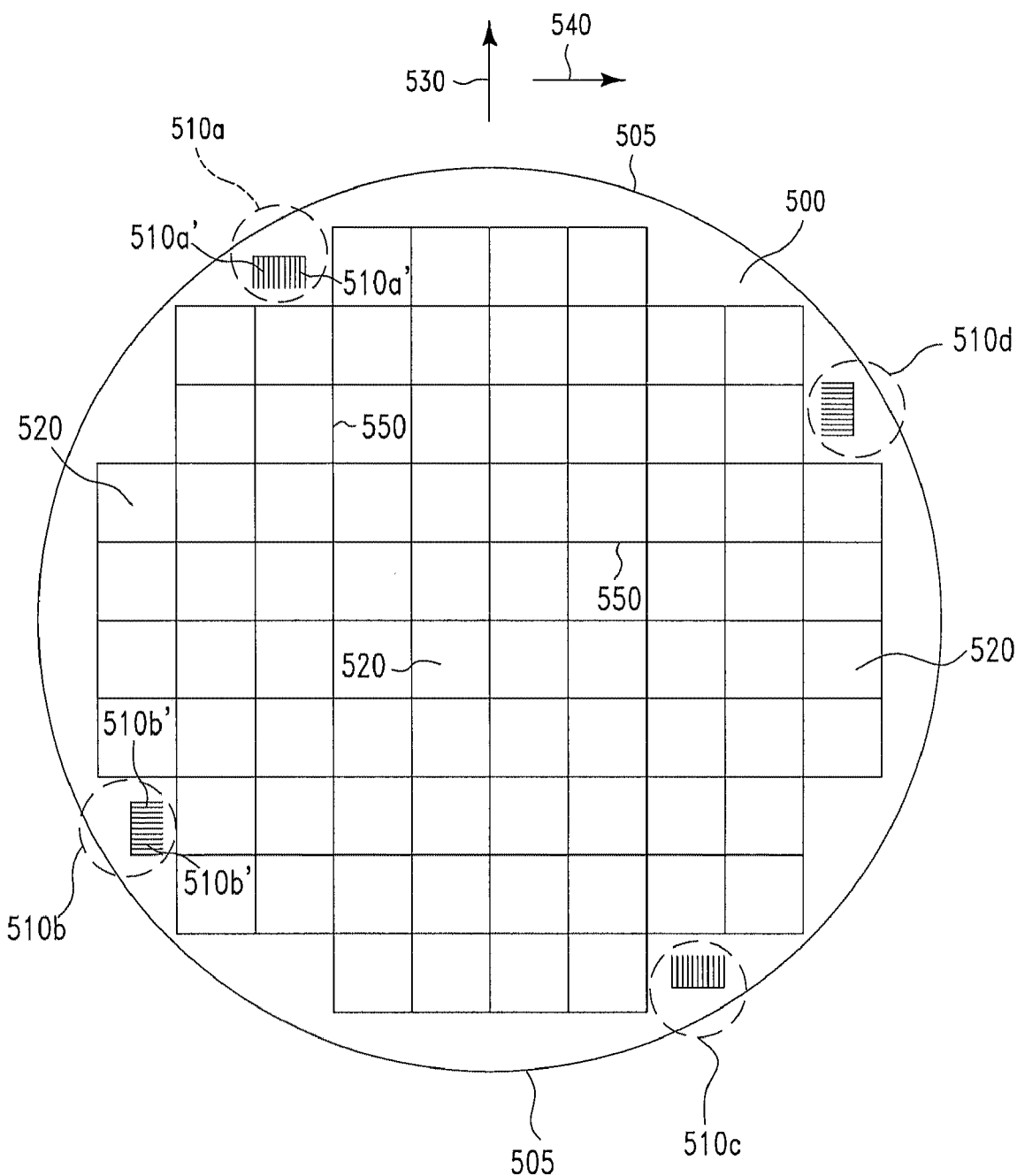
FIGS. 5 and 6 show an arrangement of different capacitive coupling structures on two wafers, in accordance with embodiments of the present invention.

FIG. 5 shows a top down view of a semiconductor wafer 500 illustrating an arrangement of, illustratively, four capacitive coupling structures 510a, 510b, 510c, and 510d near the edge 505 of the semiconductor wafer 500, in accordance with embodiments of the present invention. Each of the five capacitive coupling structures 510a, 510b, 510c, and 510d is similar in shape to the capacitive coupling structures 110 and 210 of FIG. 1. The semiconductor wafer 500 also comprises multiple integrated circuits (chips) 520.

Figure 6:
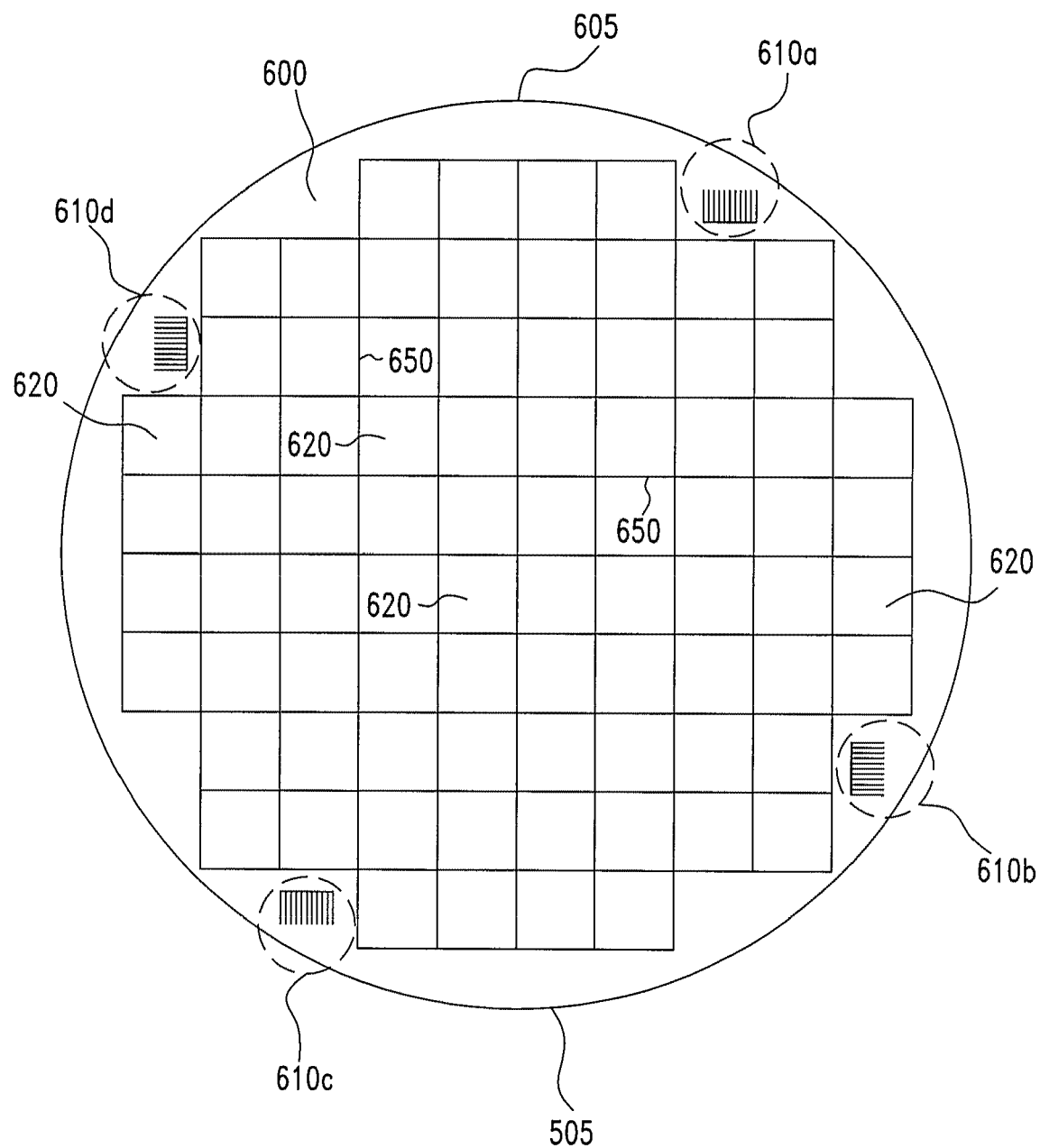

FIG. 6 shows a top down view of a semiconductor wafer 600 which is to be aligned and bonded to the semiconductor wafer 500 of FIG. 5. In one embodiment, with reference to FIGS. 5 and 6, the semiconductor wafer 600 is a mirror image of the semiconductor wafer 500 with respect to the four capacitive coupling structures 510a, 510b, 510c, and 510d. In other words, the semiconductor wafer 600 comprises four capacitive coupling structures 610a, 610b, 610c, and 610d, such that when the semiconductor wafers 500 and 600 are completely aligned, the four capacitive coupling structures 510a, 510b, 510c, and 510d are completely aligned with the four capacitive coupling structures 610a, 610b, 610c, and 610d, respectively. As a result, the four capacitive coupling structures 610a, 610b, 610c, and 610d are also near an edge 605 of the semiconductor wafer 600, In one embodiment, with reference to FIGS. 5 and 6, the fingers 510a' of the capacitive coupling structure 510a are parallel to one another and to a direction 530, whereas the fingers 510b' of the capacitive coupling structure 510b are parallel to one another and to a direction 540. In one embodiment, the directions 530 and 540 are essentially perpendicular to each other.

As a result, the capacitor 510a,610a comprising the capacitive coupling structures 510a and 610a can be used to align the semiconductor wafers 500 and 600 in the direction 540. This is because a movement of the semiconductor wafer 600 with respect to the semiconductor wafer 500 in the direction 540 would result in a significant change in the capacitance of the capacitor 510a,610a.

Similarly, the capacitor 510b,610b comprising the capacitive coupling structures 510b and 610b can be used to align the semiconductor wafers 500 and 600 in the direction 530. This is because a movement of the semiconductor wafer 600 with respect to the semiconductor wafer 500 in the direction 530 would result in a significant change in the capacitance of the capacitor 510b,610b.

In one embodiment, the semiconductor wafers 500 and 600 comprise capacitive coupling structures (not shown) in the dicing channels 550 and 650, respectively, which are similar in size and shape to the capacitive coupling structures 110 and 210 of FIGS. 1 and 1A.

In one embodiment, the semiconductor wafers 500 and 600 comprise electrically conducting lines connecting all the capacitive coupling structures of the semiconductor wafers 500 and 600 to probe pads (not shown) on the edges 505 and 506 of the semiconductor wafers 500 and 600, respectively, so that the capacitive coupling structures can be electrically accessed via the probe pads during wafer alignment. For the capacitive coupling structures residing in the dicing channels 550 and 650, the associated electrically conducting lines run along the dicing channels 550 and 650 to the associated probe pads located on the edges 505 and 506.

In one embodiment, the capacitive coupling structure 510a, 510b, 610a, and 610b have a finger width of 10 μm and a finger spacing (i.e., the distance between two adjacent fingers, such as the finger spacing 260 of the capacitive coupling structure 210 of FIG. 2A) of 50 μm, whereas the capacitive coupling structure 510c, 510d, 610c, and 610d have a finger width of 1 μm and a finger spacing of 5 μm. Assume that all the capacitive coupling fingers have the same length.

As a result, in one embodiment, the capacitors 510a,610a and 510b, 610b are used for crude alignments of the semiconductor wafers 100 and 200 in the directions 540 and 530, respectively. Then, the capacitors 510c,610c and 510d, 610d are used for fine alignments of the semiconductor wafers 100 and 200 in the directions 540 and 530, respectively. Alternatively, the capacitive coupling structures (not shown) located in the dicing channels 550 and 650 can be used for the fine alignment of the semiconductor wafers 100 and 200. It should be noted that the capacitive coupling structures of the same capacitor have the same number of fingers, but the capacitive coupling structures of different capacitors can have different number of fingers.

In the embodiments described above, the finger spacing of the capacitors used for crude alignments is five times the finger spacing of the capacitors used for fine alignments (i.e., 50 μm and 10 μm). In general, the finger spacing of the capacitors used for crude alignments is at least twice the finger spacing of the capacitors used for fine alignments.

In the embodiments described above, the finger widths of the fingers of the capacitive coupling structures 110 and 210 (FIG. 2A) are all the same. In general, with reference to FIG. 2A, these finger widths do not have to be the same. More specifically, although the finger widths of the fingers 112a and 212a are the same, the finger widths of the fingers 112a and 112b can be different.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure, comprising:
   (a) a first semiconductor wafer including a first capacitive coupling structure; and (b) a second semiconductor wafer including a second capacitive coupling structure, wherein the first and second semiconductor wafers are in direct physical contact with each other via a common surface, wherein if the first and second semiconductor wafers are moved with respect to each other by a first displacement distance of 1 nm in a first direction while the first and second semiconductor wafers are in direct physical contact with each other via the common surface, then a change of at least $10^{-18}$ F in capacitance of a first capacitor comprising the first and second capacitive coupling structures results, wherein the first direction is essentially parallel to the common surface, wherein the first capacitive coupling structure comprises a first doped semiconductor region and a first silicide region, wherein the second capacitive coupling structure comprises a second doped semiconductor region and a second silicide region, wherein the first capacitive coupling structure comprises N first capacitive coupling fingers, N being an integer greater than 1, wherein the second capacitive coupling structure comprises N second capacitive coupling fingers, wherein the N first capacitive coupling fingers are aligned one-to-one to the N second capacitive coupling fingers, wherein the N first capacitive coupling fingers and the N second capacitive coupling fingers have a same first finger width and a same first finger spacing, wherein the first semiconductor wafer further comprises a fifth capacitive coupling structure that comprises M third capacitive coupling fingers, M being an integer greater than 1, wherein the second semiconductor wafer further comprises a sixth capacitive coupling structure that comprises M fourth capacitive coupling fingers, wherein the M third capacitive coupling fingers are aligned one-to-one to the M fourth capacitive coupling fingers, wherein the M third capacitive coupling fingers and the M fourth capacitive coupling fingers have a same second finger width and a same second finger spacing, wherein the first finger width is ten times the second finger width, and wherein the first finger spacing is ten times the second finger spacing.

2. The structure of claim 1, wherein the N first capacitive coupling fingers are parallel to one another, and wherein the N first capacitive coupling fingers have a same finger width.

3. The structure of claim 1, wherein the N first capacitive coupling fingers are parallel to one another, and wherein the N first capacitive coupling fingers do not have a same finger width.

4. The structure of claim 1, wherein the first semiconductor wafer further comprises a third capacitive coupling structure, wherein the second semiconductor wafer further comprises a fourth capacitive coupling structure, wherein if the first and second semiconductor wafers are moved with respect to each other by a second displacement distance of 1 nm in a second direction while the first and second semiconductor wafers are in direct physical contact with each other via the common surface, then a change of at least $10^{-18}$ F in capacitance of a second capacitor comprising the third and fourth capacitive coupling structures results, wherein the second direction is essentially parallel to the common surface, wherein the first and second directions are essentially perpendicular to each other, wherein the first semiconductor wafer further comprises a first device layer and a first plurality of interconnect layers, wherein the third capacitive coupling structure resides in a first next-to-top interconnect layer of the first plurality of interconnect layers, wherein the second semiconductor wafer further comprises a second device layer and a second plurality of interconnect layers, and wherein the fourth capacitive coupling structure resides in a second next-to-top interconnect layer of the second plurality of interconnect layers.

5. The structure of claim 1, wherein the first capacitive coupling structure resides in a first dicing channel of the first semiconductor wafer, and wherein the second capacitive coupling structure resides in a second dicing channel of the second semiconductor wafer.

6. The structure of claim 1, wherein the first capacitive coupling structure does not reside in a dicing channel or a chip area of the first semiconductor wafer, and wherein the second capacitive coupling structure does not reside in a dicing channel or a chip area of the second semiconductor wafer.

7. A wafer alignment method, comprising:

providing a structure which includes (a) a first semiconductor wafer comprising a first capacitive coupling structure, and (b) a second semiconductor wafer comprising a second capacitive coupling structure;

measuring a capacitance of a first capacitor comprising the first and second capacitive coupling structures; and moving the first and second semiconductor wafers with respect to each other in a first direction while the first and second semiconductor wafers are in direct physical contact with each other via a common surface, until the first capacitor has a first maximum capacitance as measured in said measuring the capacitance of the first capacitor, wherein the first direction is essentially parallel to the common surface, wherein the first capacitive coupling structure comprises N first capacitive coupling fingers, N being an integer greater than 1, wherein the second capacitive coupling structure comprises N second capacitive coupling fingers, wherein the N first capacitive coupling fingers are aligned one-to-one to the N second capacitive coupling fingers, wherein the N first capacitive coupling fingers and the N second capacitive coupling fingers have a same first finger width and a same first finger spacing, wherein the first semiconductor wafer further comprises a fifth capacitive coupling structure that comprises M third capacitive coupling fingers, M being an integer greater than 1, wherein the second semiconductor wafer further comprises a sixth capacitive coupling structure that comprises M fourth capacitive coupling fingers, wherein the M third capacitive coupling fingers are aligned one-to-one to the M fourth capacitive coupling fingers, wherein the M third capacitive coupling fingers and the M fourth capacitive coupling fingers have a same second finger width and a same second finger spacing, wherein the first finger width is ten times the second finger width, and wherein the first finger spacing is ten times the second finger spacing.

8. The method of claim 7, further comprising:
measuring a capacitance of a second capacitor comprising third and fourth capacitive coupling structures, wherein the first semiconductor wafer further comprises the third capacitive coupling structure, and wherein the second semiconductor wafer further comprises the fourth capacitive coupling structure; and
moving the first and second semiconductor wafers with respect to each other in a second direction while the first and second semiconductor wafers are in direct physical contact with each other via the common surface, until the second capacitor has a second maximum capacitance as measured in said measuring the capacitance of the second capacitor, wherein the second direction is essentially parallel to the common surface, and wherein the first and second directions are essentially perpendicular to each other.

9. The method of claim 7, wherein if the first and second semiconductor wafers are moved with respect to each other by a displacement distance of 1 nm in the first direction while the first and second semiconductor wafers are in direct physical contact with each other via the common surface, then a change of at least $10^{18}$ F in capacitance of the first capacitor results.

10. The method of claim 7,
wherein the N first capacitive coupling fingers are parallel to one another, and wherein the N first capacitive coupling fingers have a same finger width.

11. The method of claim 7,
wherein the N first capacitive coupling fingers are parallel to one another, and
wherein the N first capacitive coupling fingers do not have a same finger width.

12. The method of claim 7,
wherein the first capacitive coupling structure resides in a first dicing channel of the first semiconductor wafer, and
wherein the second capacitive coupling structure resides in a second dicing channel of the second semiconductor wafer.

13. The method of claim 7,
wherein the first capacitive coupling structure does not reside in a dicing channel or a chip area of the first semiconductor wafer, and
wherein the second capacitive coupling structure does not reside in a dicing channel or a chip area of the second semiconductor.

* * * * *